(12) United States Patent
Hayashi (10) Patent No.: US 11,611,013 B2
(45) Date of Patent: Mar. 21, 2023

(54) METHOD FOR MANUFACTURING LIGHT-EMITTING ELEMENT

(71) Applicant: NICHIA CORPORATION, Anan (JP)

(72) Inventor: Seiichi Hayashi, Anan (JP)

(73) Assignee: NICHIA CORPORATION, Anan (JP)

( * ) Notice: Subject to any disclaimer, the term of this patent is extended or adjusted under 35 U.S.C. 154(b) by 168 days.

(21) Appl. No.: 17/231,292

(22) Filed: Apr. 15, 2021

(65) Prior Publication Data

US 2021/0328095 A1 Oct. 21, 2021

(30) Foreign Application Priority Data

Apr. 21, 2020 (JP) .............................. JP2020-075319

(51) Int. Cl.
*H01L 33/00* (2010.01)
*H01L 33/32* (2010.01)
*H01L 33/02* (2010.01)
*H01L 33/08* (2010.01)

(52) U.S. Cl.
CPC ........ *H01L 33/0075* (2013.01); *H01L 33/025* (2013.01); *H01L 33/08* (2013.01); *H01L 33/32* (2013.01); *H01L 33/325* (2013.01)

(58) Field of Classification Search
CPC ... H01L 33/325; H01L 33/20; H01L 33/0075; H01L 33/007; H01L 33/04; H01L 33/32; H01L 33/025; H01L 33/505
See application file for complete search history.

(56) References Cited

U.S. PATENT DOCUMENTS

| | | |
|---|---|---|
| 2004/0066816 A1 | 4/2004 | Collins et al. |
| 2006/0097269 A1 | 5/2006 | Lester |
| 2007/0194330 A1 | 8/2007 | Ibbetson et al. |
| 2010/0207100 A1 | 8/2010 | Strassburg et al. |
| 2011/0278641 A1 | 11/2011 | Grolier et al. |
| 2017/0213868 A1 | 7/2017 | Damilano et al. |

(Continued)

FOREIGN PATENT DOCUMENTS

| | | |
|---|---|---|
| JP | 2004-128502 A | 4/2004 |
| JP | 2005-019874 A | 1/2005 |
| JP | 2007-109713 A | 4/2007 |

(Continued)

*Primary Examiner* — Savitri Mulpuri
(74) *Attorney, Agent, or Firm* — Foley & Lardner LLP (57) ABSTRACT

A method includes forming a first n-type nitride semiconductor layer; forming a first light-emitting layer on the first n-type nitride semiconductor layer; forming a first nitride semiconductor layer on the first light-emitting layer by introducing a gas comprising gallium and having a first flow rate; forming a first p-type nitride semiconductor layer on the first nitride semiconductor layer; forming an n-type intermediate layer on the first p-type nitride semiconductor layer; forming a second n-type nitride semiconductor layer on the n-type intermediate layer; forming a second light-emitting layer on the second n-type nitride semiconductor layer; forming a second nitride semiconductor layer on the second light-emitting layer by introducing a gas comprising gallium and having a second flow rate; and forming a second p-type nitride semiconductor layer on the second nitride semiconductor layer. The first flow rate is less than the second flow rate.

18 Claims, 10 Drawing Sheets

(56) References Cited

U.S. PATENT DOCUMENTS

2020/0343412 A1\*  10/2020  Hayashi ................ H01L 33/325
2021/0202790 A1\*  7/2021  Hayashi ................ H01L 33/007

FOREIGN PATENT DOCUMENTS

| JP | 2007-288052 A | 11/2007 |
| JP | 2008-518440 A | 5/2008 |
| JP | 2009-527920 A | 7/2009 |
| JP | 2010-532926 A | 10/2010 |
| JP | 2012-508458 A | 4/2012 |
| JP | 2016-162876 A | 9/2016 |
| JP | 2017-513225 A | 5/2017 |
| WO | WO-2007/106220 A1 | 9/2007 |

\* cited by examiner

METHOD FOR MANUFACTURING LIGHT-EMITTING ELEMENT

CROSS-REFERENCE TO RELATED APPLICATION

This application claims priority to Japanese Patent Application No. 2020-075319, filed on Apr. 21, 2020, the disclosure of which is hereby incorporated by reference in its entirety.

BACKGROUND

The present disclosure relates to a method for manufacturing a light-emitting element.

JP-A 2004-128502 discusses a light-emitting device that includes two active regions stacked inside a stacked semiconductor, and a tunnel junction is formed between the two active regions. In such a light-emitting device, it is desirable to form the tunnel junction so that the n-type layer and the p-type layer of the tunnel junction, which have high impurity concentrations, have good crystallinity.

SUMMARY

According to certain embodiments of the present disclosure, a method for manufacturing a light-emitting element in which semiconductor layers have good crystallinity is provided.

According to one embodiment, a method for manufacturing a light-emitting element includes forming a first n-type nitride semiconductor layer comprising an n-type impurity; forming a first light-emitting layer on the first n-type nitride semiconductor layer; forming a first nitride semiconductor layer on the first light-emitting layer by introducing, to a reactor, a gas comprising nitrogen and a gas having a first flow rate and comprising gallium, the first nitride semiconductor layer being undoped; forming a first p-type nitride semiconductor layer on the first nitride semiconductor layer; forming an n-type intermediate layer on the first p-type nitride semiconductor layer, the n-type intermediate layer being made of a nitride semiconductor layer comprising an n-type impurity and having a higher impurity concentration than the first n-type nitride semiconductor layer; forming a second n-type nitride semiconductor layer on the n-type intermediate layer; forming a second light-emitting layer on the second n-type nitride semiconductor layer; forming a second nitride semiconductor layer on the second light-emitting layer by introducing, to the reactor, a gas comprising nitrogen and a gas having a second flow rate and comprising gallium, the second nitride semiconductor layer being undoped; and forming a second p-type nitride semiconductor layer on the second nitride semiconductor layer. The first flow rate is less than the second flow rate.

Such a method may provide a light-emitting element in which semiconductor layers have good crystallinity.

DETAILED DESCRIPTION

Embodiments will now be described with reference to the drawings. The same components in the drawings are marked with the same reference numerals.

Figure 1:
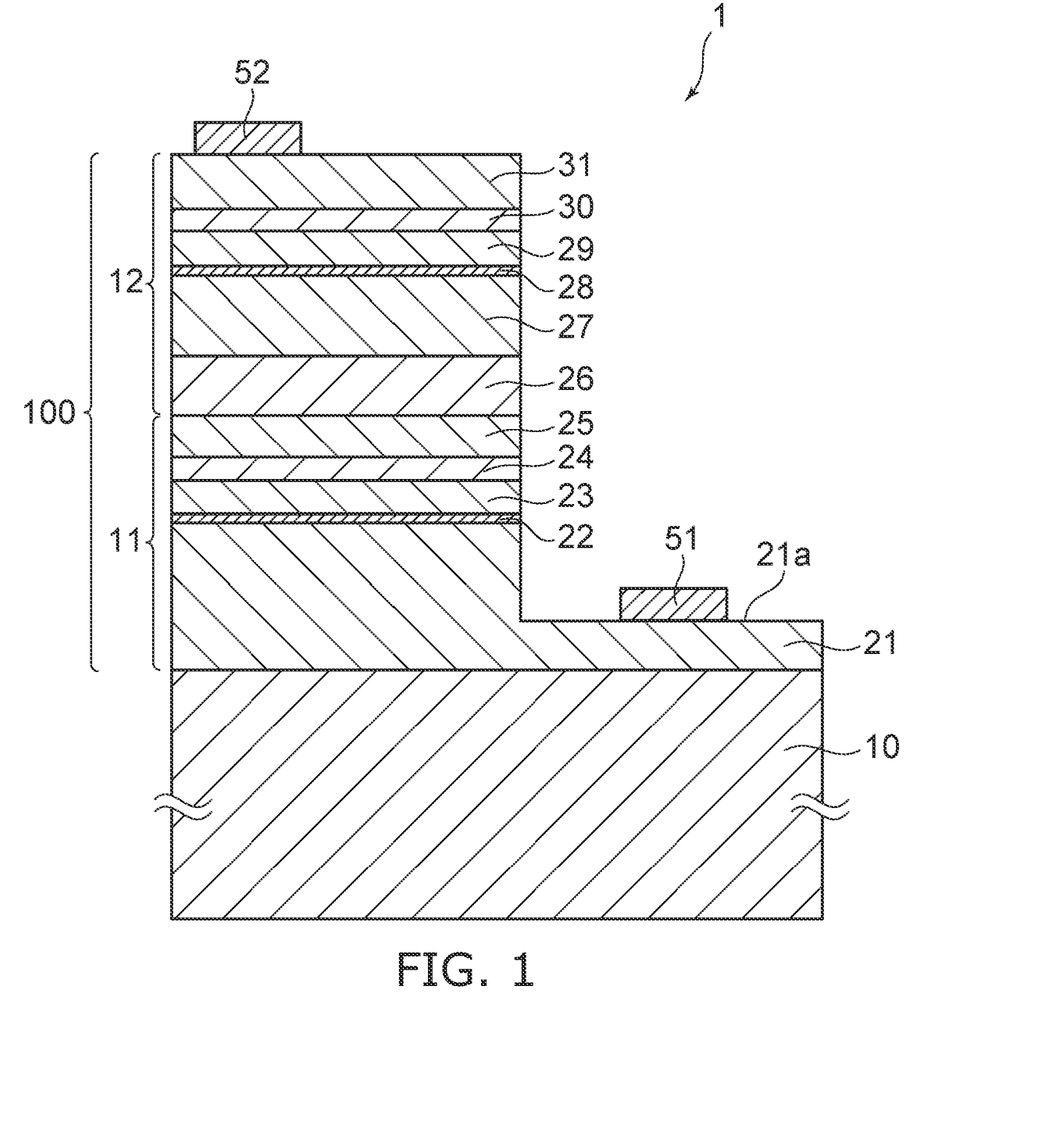
FIG. 1 is a schematic cross-sectional view of a light-emitting element of an embodiment of the invention.

FIG. 1 is a schematic cross-sectional view of a light-emitting element 1 of an embodiment of the invention.

The light-emitting element 1 of the embodiment includes a substrate 10, a semiconductor stacked body 100 provided on the substrate 10, an n-side electrode 51, and a p-side electrode 52.

The semiconductor stacked body 100 is a stacked body in which multiple semiconductor layers made of nitride semiconductors are stacked. In the specification, "nitride semiconductor" includes all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively.

The semiconductor stacked body 100 includes a first stacked part 11 provided on the substrate 10, and a second stacked part 12 provided on the first stacked part 11.

The material of the substrate 10 is, for example, sapphire, silicon, SiC, GaN, etc. When semiconductor layers made of nitride semiconductors are used as the semiconductor stacked body 100, it is favorable for sapphire or GaN to be used as the material of the substrate 10.

The first stacked part 11 includes a first n-type nitride semiconductor layer 21 provided on the substrate 10, a first light-emitting layer 22 provided on the first n-type nitride semiconductor layer 21, a first p-cladding layer 23 provided on the first light-emitting layer 22, a first nitride semiconductor layer 24 provided on the first p-cladding layer 23, and a first p-type nitride semiconductor layer 25 provided on the first nitride semiconductor layer 24.

The first n-type nitride semiconductor layer 21 includes gallium nitride (GaN) and is doped with, for example, silicon (Si) as an n-type impurity. Other than silicon (Si), the first n-type nitride semiconductor layer 21 may include indium (In) and aluminum (Al). The first n-type nitride semiconductor layer 21 may include a semiconductor layer made of undoped GaN. Here, an undoped layer is a layer formed without using a source gas for intentionally doping an impurity (e.g., a gas including Si and/or Mg) to control the conductivity and may include an impurity due to inevitable mixing due to the processes. For example, the impurity concentration of the first nitride semiconductor layer 24 is not more than $1 \times 10^{18}/cm^3$.

The first light-emitting layer 22 is provided between the first n-type nitride semiconductor layer 21 and the first p-cladding layer 23. For example, the first light-emitting layer 22 has a multi-quantum well structure including multiple well layers and multiple barrier layers. For example, the multiple well layers can include InGaN including In. The multiple barrier layers can include, for example, GaN.

The first p-cladding layer 23 and the first p-type nitride semiconductor layer 25 include gallium nitride (GaN) and are doped with, for example, magnesium (Mg) as a p-type impurity. Other than magnesium (Mg), the first p-cladding layer 23 and the first p-type nitride semiconductor layer 25 may include indium (In) and aluminum (Al).

The p-type impurity concentration of the first p-type nitride semiconductor layer 25 is greater than the p-type impurity concentration of the first p-cladding layer 23. For example, the Mg concentration of the first p-type nitride semiconductor layer 25 including Mg as the p-type impurity is not less than $5\times10^{19}/cm^3$ and not more than $2\times10^{21}/cm^3$. The first p-type nitride semiconductor layer 25 includes a p-type impurity with a higher concentration than the first p-cladding layer 23.

The first nitride semiconductor layer 24 is provided between the first p-cladding layer 23 and the first p-type nitride semiconductor layer 25. The first nitride semiconductor layer 24 is an undoped layer.

The first nitride semiconductor layer 24 is made of, for example, gallium nitride (GaN). Other than gallium nitride (GaN), the first nitride semiconductor layer 24 may include indium (In) and aluminum (Al).

The second stacked part 12 includes an n-type intermediate layer 26 provided on the first p-type nitride semiconductor layer 25, a second n-type nitride semiconductor layer 27 provided on the n-type intermediate layer 26, a second light-emitting layer 28 provided on the second n-type nitride semiconductor layer 27, a second p-cladding layer 29 provided on the second light-emitting layer 28, a second nitride semiconductor layer 30 provided on the second p-cladding layer 29, and a second p-type nitride semiconductor layer 31 provided on the second nitride semiconductor layer 30.

The n-type intermediate layer 26 and the second n-type nitride semiconductor layer 27 include gallium nitride (GaN) and are doped with, for example, silicon (Si) as an n-type impurity. Other than silicon (Si), the second n-type nitride semiconductor layer 27 may include indium (In) and aluminum (Al).

The n-type impurity concentration of the n-type intermediate layer 26 is greater than the n-type impurity concentration of the second n-type nitride semiconductor layer 27. For example, the Si concentration of the n-type intermediate layer 26 including Si as the n-type impurity is not less than $1\times10^{20}/cm^3$ and not more than $5\times10^{21}/cm^3$. The n-type intermediate layer 26 includes an n-type impurity with a higher concentration than the second n-type nitride semiconductor layer 27.

The second light-emitting layer 28 is provided between the second n-type nitride semiconductor layer 27 and the second p-cladding layer 29. For example, the second light-emitting layer 28 has a multi-quantum well structure including multiple well layers and multiple barrier layers. For example, the well layers and the barrier layers of the second light-emitting layer 28 include semiconductor layers similar to those of the first light-emitting layer 22 described above.

The second p-cladding layer 29 and the second p-type nitride semiconductor layer 31 include gallium nitride (GaN) and are doped with, for example, magnesium (Mg) as a p-type impurity. Other than magnesium (Mg), the second p-cladding layer 29 and the second p-type nitride semiconductor layer 31 may include indium (In) and aluminum (Al).

The p-type impurity concentration of the second p-type nitride semiconductor layer 31 is greater than the p-type impurity concentration of the second p-cladding layer 29.

The second nitride semiconductor layer 30 is provided between the second p-cladding layer 29 and the second p-type nitride semiconductor layer 31. The second nitride semiconductor layer 30 is an undoped layer. For example, the impurity concentration of the second nitride semiconductor layer 30 is not more than $1\times10^{18}/cm^3$. The second nitride semiconductor layer 30 is made of, for example, gallium nitride (GaN). Other than gallium nitride (GaN), the second nitride semiconductor layer 30 may include indium (In) and aluminum (Al).

The p-side electrode 52 is provided on the second p-type nitride semiconductor layer 31, and the p-side electrode 52 is electrically connected to the second p-type nitride semiconductor layer 31.

The first n-type nitride semiconductor layer 21 includes an n-contact surface 21a where the first light-emitting layer 22, the first p-cladding layer 23, the first nitride semiconductor layer 24, the first p-type nitride semiconductor layer 25, and the second stacked part 12 are not provided. The n-side electrode 51 is provided on the n-contact surface 21a, and the n-side electrode 51 is electrically connected to the first n-type nitride semiconductor layer 21.

A forward voltage is applied between the p-side electrode 52 and the n-side electrode 51. At this time, the forward voltage is applied to the first light-emitting layer 22 of the first stacked part 11, and the first light-emitting layer 22 emits light due to holes and electrons supplied to the first light-emitting layer 22. The forward voltage also is applied to the second light-emitting layer 28 of the second stacked part 12, and the second light-emitting layer 28 emits light due to holes and electrons supplied to the second light-emitting layer 28.

The light emission peak wavelength of the first light-emitting layer 22 and the light emission peak wavelength of the second light-emitting layer 28 are, for example, not less than 430 nm and not more than 540 nm. For example, the first light-emitting layer 22 and the second light-emitting layer 28 emit blue light and/or green light. Compared to a light-emitting element including one light-emitting layer, the output per unit area of one light-emitting element can be increased by stacking the second light-emitting layer 28 on the first light-emitting layer 22. The light emission peak wavelength of the first light-emitting layer 22 and the light emission peak wavelength of the second light-emitting layer 28 may be different.

When a positive potential is applied to the p-side electrode 52 and a potential (e.g., a negative potential) that is less than that of the p-side electrode 52 is applied to the n-side electrode 51, a reverse voltage is applied between the first p-type nitride semiconductor layer 25 of the first stacked part 11 and the n-type intermediate layer 26 of the second stacked part 12. Therefore, the current between the first p-type nitride semiconductor layer 25 and the n-type intermediate layer 26 utilizes the tunnel effect. That is, the current flows due to tunneling of electrons existing in the valence band of the first p-type nitride semiconductor layer 25 into the conduction band of the n-type intermediate layer 26.

To obtain such a tunnel effect, a p-n junction is formed of the first p-type nitride semiconductor layer 25 doped with a high concentration of a p-type impurity and the n-type intermediate layer 26 doped with a high concentration of an n-type impurity. The width of the depletion layer formed by the first p-type nitride semiconductor layer 25 and the n-type intermediate layer 26 is set to be narrow. By such a structure, the electrons of the valence band of the first p-type nitride semiconductor layer 25 can move into the conduction band of the n-type intermediate layer 26 by tunneling through the depletion layer formed by the first p-type nitride semiconductor layer 25 and the n-type intermediate layer 26. By setting the width of the depletion layer formed by the first p-type nitride semiconductor layer 25 and the n-type intermediate layer 26 to be narrow, the tunneling of the electrons can be efficiently performed, and a drive voltage Vf of the light-emitting element can be low compared to when using the first p-type nitride semiconductor layer 25 doped with a low concentration of the p-type impurity and the n-type intermediate layer 26 doped with a low concentration of the n-type impurity. Because it is necessary to dope the first p-type nitride semiconductor layer 25 and the n-type intermediate layer 26 with high-concentration impurities, it is favorable for the surface state of the semiconductor layer used as the foundation layer to be good.

For example, the Si concentration of the n-type intermediate layer 26 including Si as the n-type impurity is not less than $1\times10^{20}/cm^3$ and not more than $5\times10^{21}/cm^3$. The Mg concentration of the first p-type nitride semiconductor layer 25 including Mg as the p-type impurity is not less than $5\times10^{19}/cm^3$ and not more than $2\times10^{21}/cm^3$. The width of the depletion layer formed by such a first p-type nitride semiconductor layer 25 and such an n-type intermediate layer 26 is, for example, not less than 5 nm and not more than 8 nm.

Compared to a light-emitting element including one light-emitting layer, the output per unit area of the light-emitting element 1 of the embodiment can be increased because the two light-emitting layers of the first light-emitting layer 22 and the second light-emitting layer 28 are stacked in the semiconductor stacked body 100.

FIGS. 2 to 13 are schematic cross-sectional views showing a method for manufacturing the light-emitting element 1 of the embodiment. The layers of the semiconductor stacked body 100 described above are epitaxially grown on the substrate 10 by MOCVD (metal organic chemical vapor deposition) inside a reactor in which the pressure and the temperature are adjustable.

Figure 2:
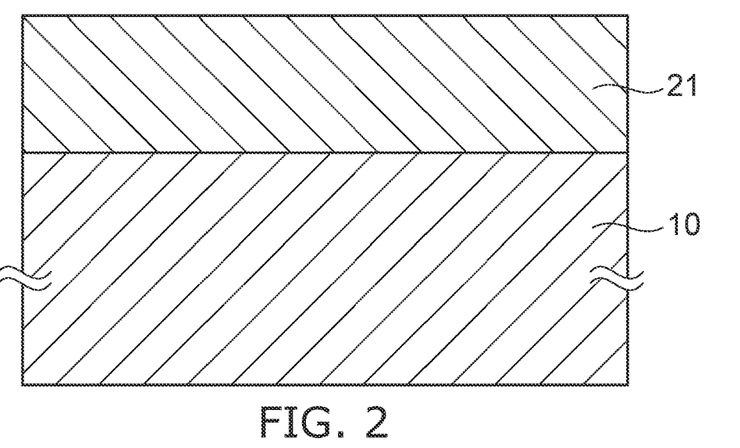
FIG. 2 to FIG. 13 are schematic cross-sectional views showing the method for manufacturing the light-emitting element of the embodiment of the invention.

First, as shown in FIG. 2, the first n-type nitride semiconductor layer 21 is formed on the substrate 10.

Figure 3:
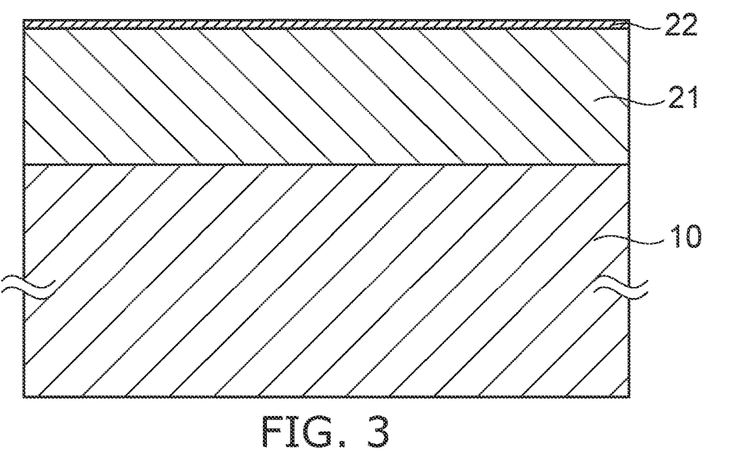

As shown in FIG. 3, the first light-emitting layer 22 is formed on the first n-type nitride semiconductor layer 21. The first light-emitting layer 22 contacts the first n-type nitride semiconductor layer 21.

Figure 4:
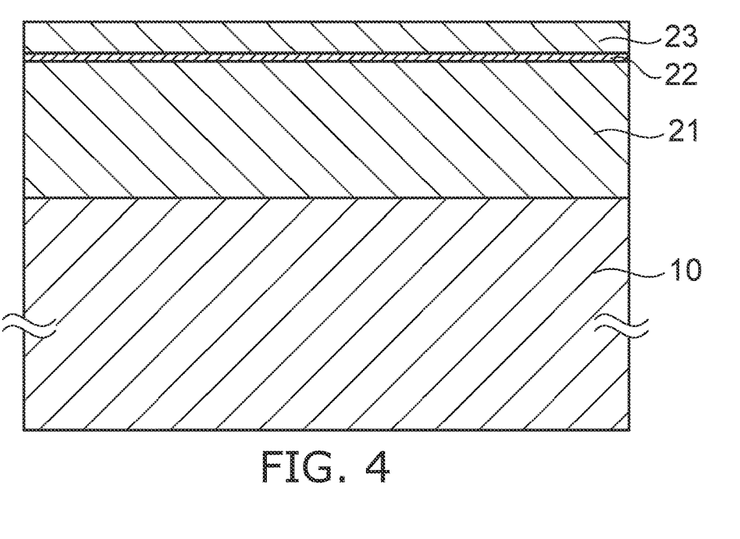

As shown in FIG. 4, the first p-cladding layer 23 is formed on the first light-emitting layer 22. The first p-cladding layer 23 contacts the first light-emitting layer 22.

Figure 5:
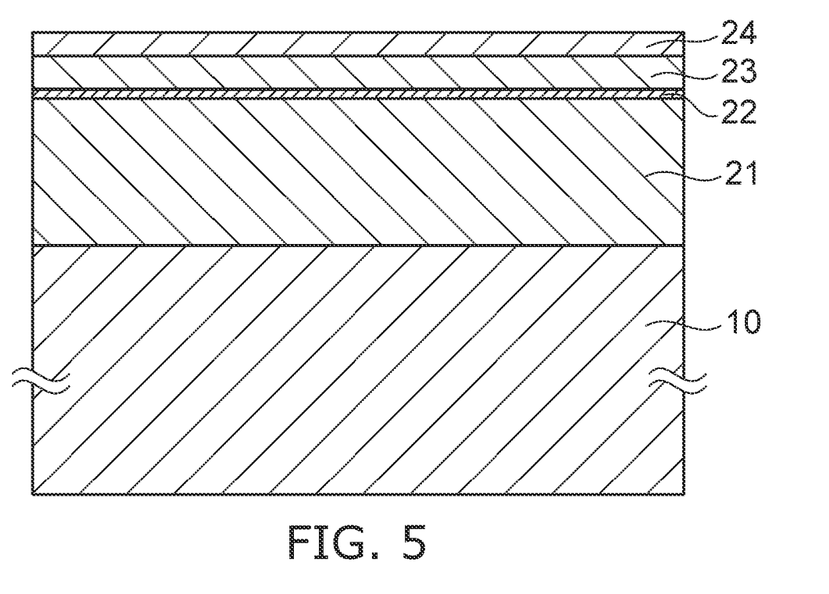

As shown in FIG. 5, the first nitride semiconductor layer 24 is formed on the first p-cladding layer 23. The first nitride semiconductor layer 24 contacts the first p-cladding layer 23.

Figure 6:
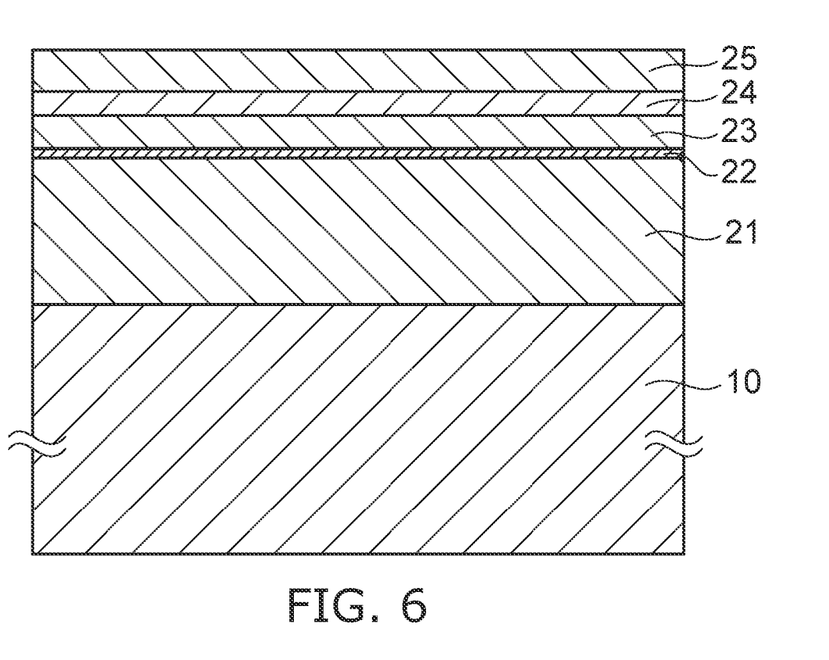

As shown in FIG. 6, the first p-type nitride semiconductor layer 25 is formed on the first nitride semiconductor layer 24. The first p-type nitride semiconductor layer 25 contacts the first nitride semiconductor layer 24.

Figure 7:
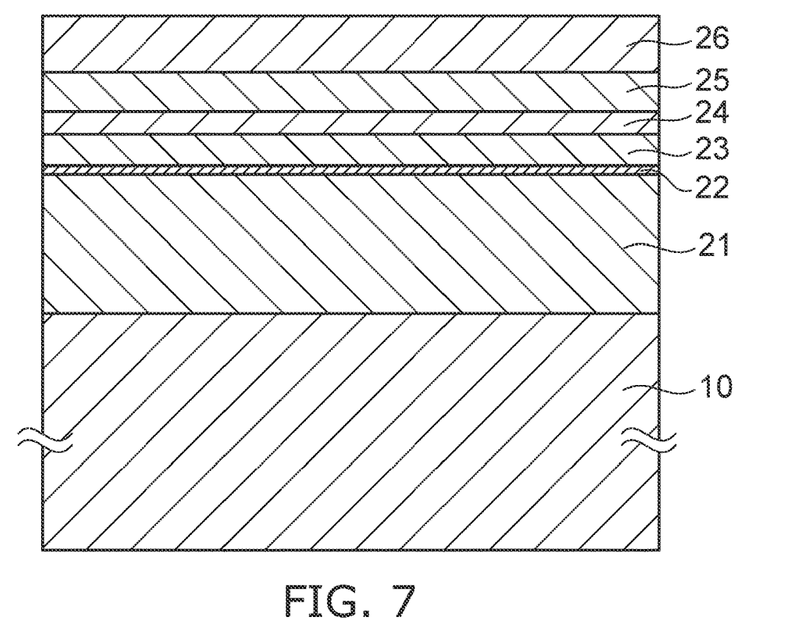

As shown in FIG. 7, the n-type intermediate layer 26 is formed on the first p-type nitride semiconductor layer 25. The n-type intermediate layer 26 contacts the first p-type nitride semiconductor layer 25.

Figure 8:
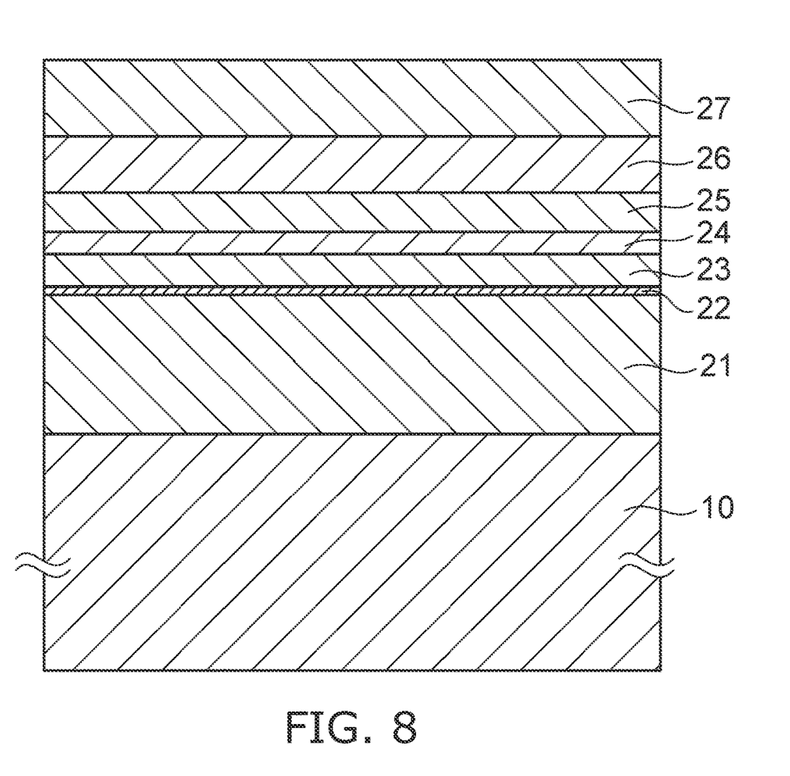

As shown in FIG. 8, the second n-type nitride semiconductor layer 27 is formed on the n-type intermediate layer 26. The second n-type nitride semiconductor layer 27 contacts the n-type intermediate layer 26.

Figure 9:
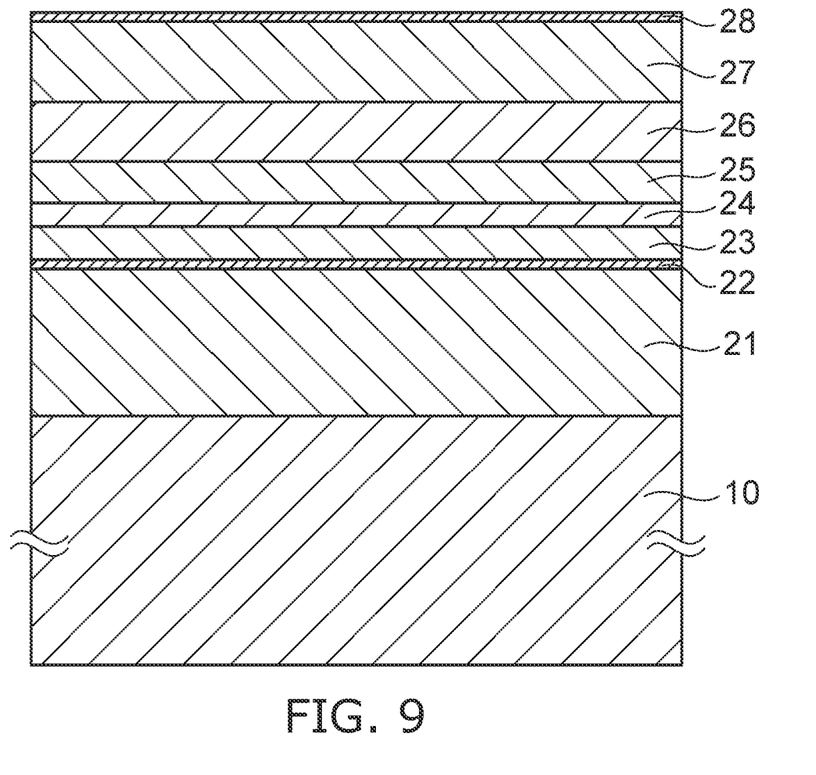

As shown in FIG. 9, the second light-emitting layer 28 is formed on the second n-type nitride semiconductor layer 27. The second light-emitting layer 28 contacts the second n-type nitride semiconductor layer 27.

Figure 10:
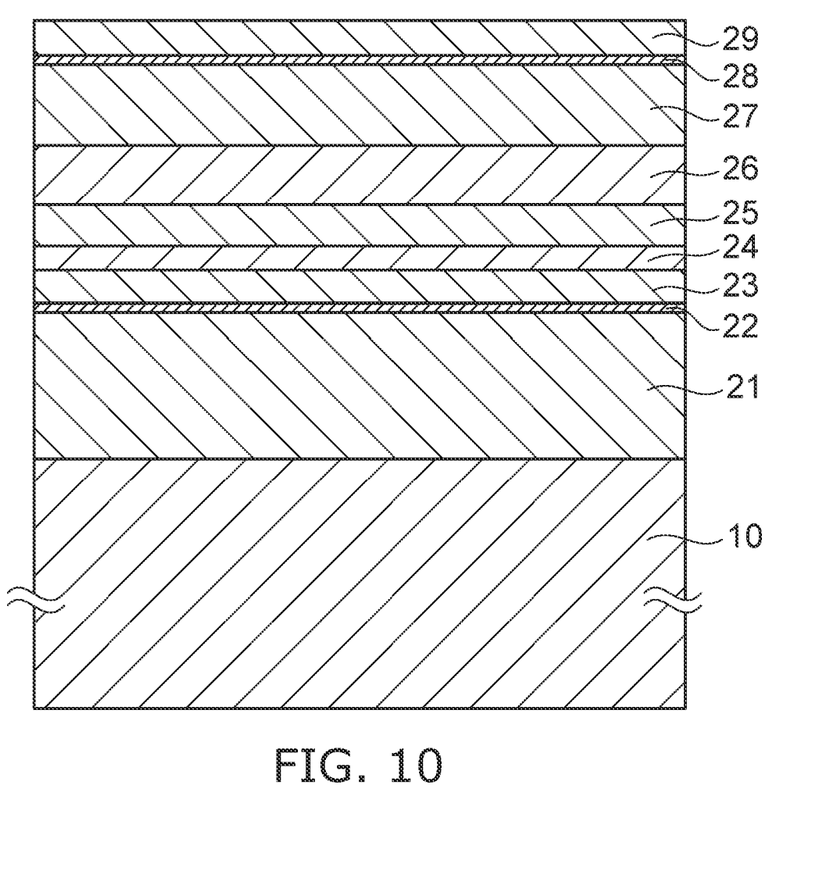

As shown in FIG. 10, the second p-cladding layer 29 is formed on the second light-emitting layer 28. The second p-cladding layer 29 contacts the second light-emitting layer 28.

Figure 11:
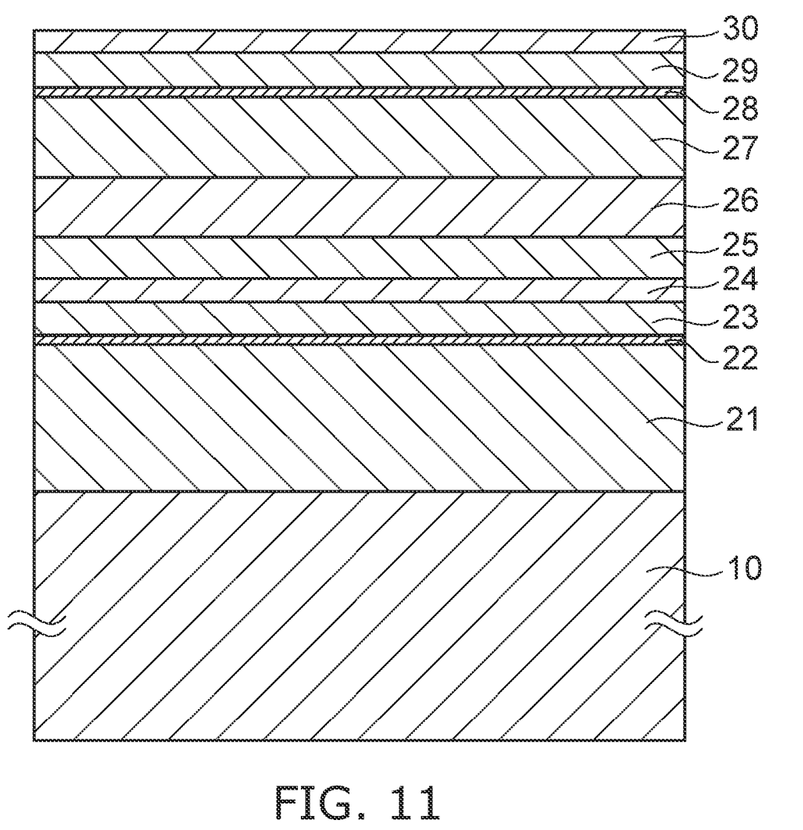

As shown in FIG. 11, the second nitride semiconductor layer 30 is formed on the second p-cladding layer 29. The second nitride semiconductor layer 30 contacts the second p-cladding layer 29.

Figure 12:
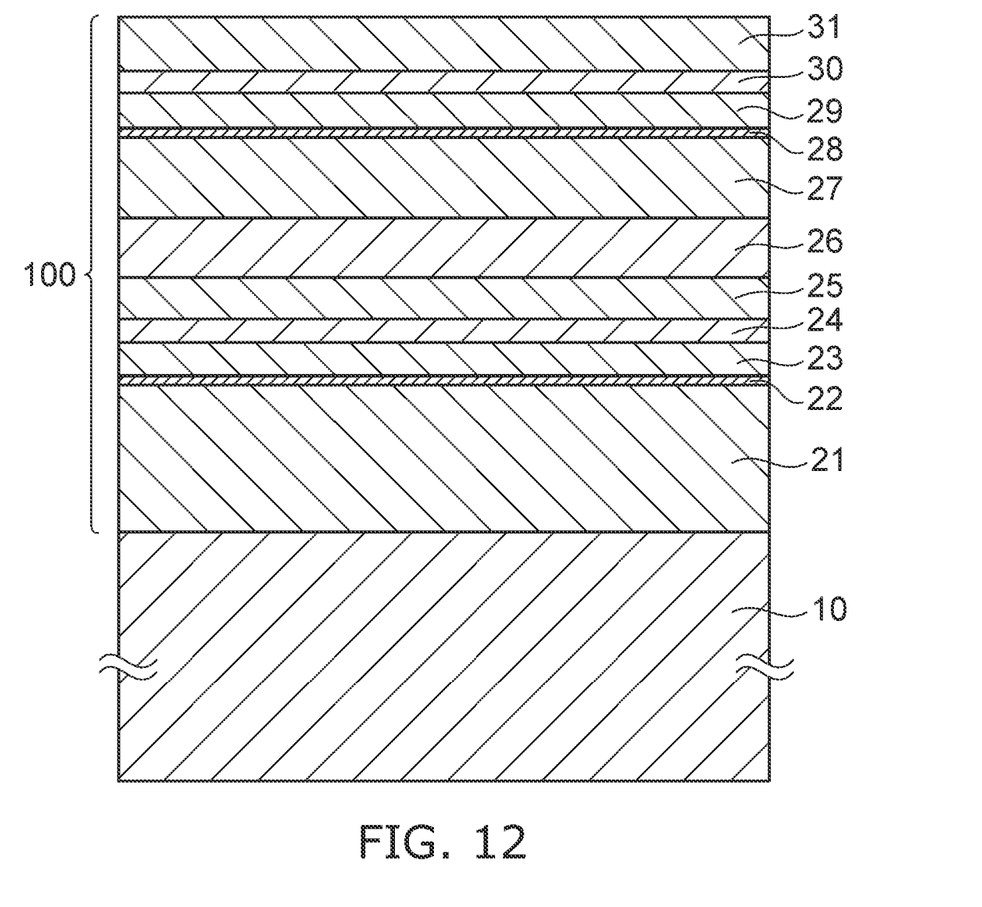

As shown in FIG. 12, the second p-type nitride semiconductor layer 31 is formed on the second nitride semiconductor layer 30. The second p-type nitride semiconductor layer 31 contacts the second nitride semiconductor layer 30. Thus, the semiconductor stacked body 100 is formed on the substrate 10.

Figure 13:
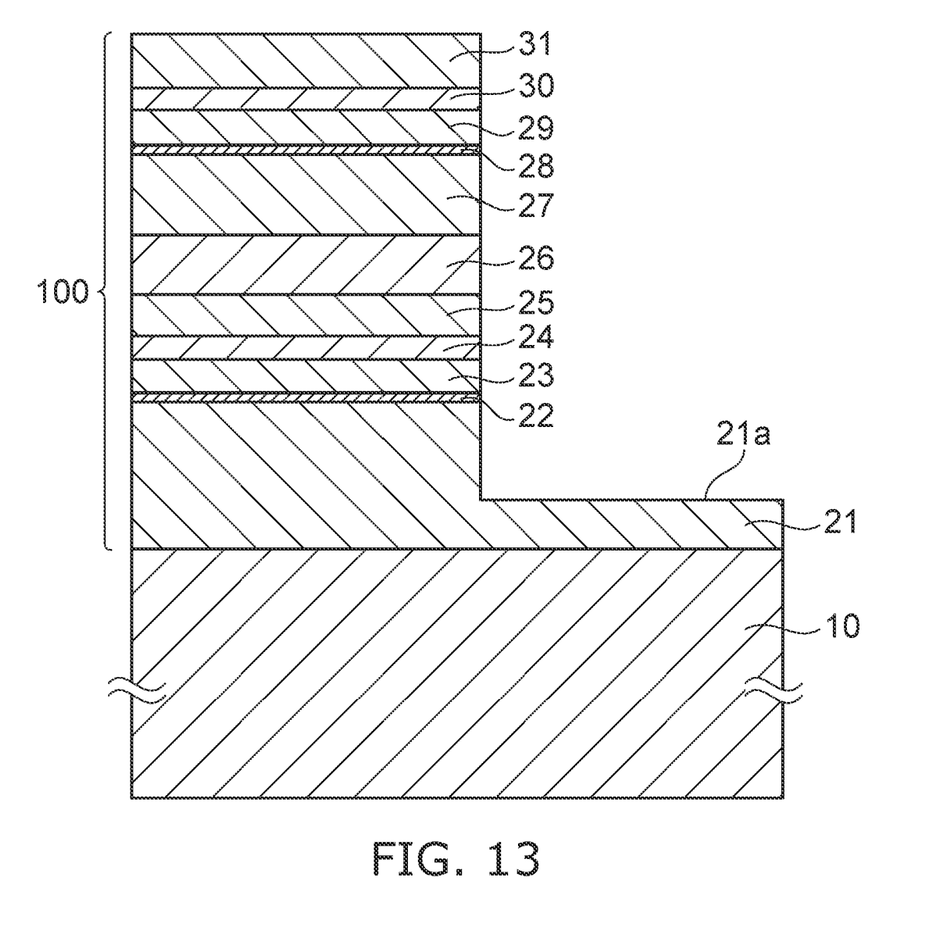

Subsequently, the n-contact surface 21a is formed by exposing a portion of the first n-type nitride semiconductor layer 21 as shown in FIG. 13 by removing a portion of the semiconductor stacked body 100.

Subsequently, as shown in FIG. 1, the p-side electrode 52 is formed on the second p-type nitride semiconductor layer 31, and the n-side electrode 51 is formed on the n-contact surface 21a.

The layers of the semiconductor stacked body 100 are formed by introducing, to a heated reactor, a carrier gas, a gas including gallium, and a gas including nitrogen. When forming a p-type layer, a gas that includes a p-type impurity also is introduced to the reactor. When forming an n-type layer, a gas that includes an n-type impurity also is introduced to the reactor.

The carrier gas is, for example, nitrogen ($N_2$) gas or hydrogen ($H_2$) gas. The gas including gallium is, for example, TMG (trimethylgallium) gas or TEG (triethylgallium) gas. The gas including nitrogen is, for example, ammonia ($NH_3$) gas.

It is favorable for the first nitride semiconductor layer 24 to be formed to have good crystallinity because the first nitride semiconductor layer 24 is used as the foundation layer when forming the first p-type nitride semiconductor layer 25 and the n-type intermediate layer 26 that form the tunnel junction. For example, it is favorable for the crystallinity of the first nitride semiconductor layer 24 to be good so that the diameters of V-pits are small or the occurrence of V-pits is low for the surface of the first nitride semiconductor layer 24 after stacking. The first nitride semiconductor layer 24 is formed using film formation conditions so that such a surface state of the first nitride semiconductor layer 24 is obtained. Here, V-pits are concave pits occurring in the surface of the semiconductor layer due to dislocations formed in the semiconductor layer.

The first nitride semiconductor layer 24 is formed as follows. After forming the first p-cladding layer 23, the first nitride semiconductor layer 24 is formed on the first p-cladding layer 23 in a state in which a carrier gas, a gas including gallium, and a gas including nitrogen are introduced to a reactor, and the reactor is heated to a first temperature. For example, an undoped GaN layer is formed as the first nitride semiconductor layer 24. By forming the first nitride semiconductor layer 24 as an undoped GaN layer, the degradation of the surface state due to doping with an impurity or growth of a mixed crystal of Al, etc., can be suppressed, and the crystallinity can be good. The film thickness of the first nitride semiconductor layer 24 is, for example, not less than 50 nm and not more than 100 nm.

It is favorable for the second nitride semiconductor layer 30 to be formed to have good crystallinity because the second nitride semiconductor layer 30 is used as the foundation layer when forming the second p-type nitride semiconductor layer 31. For example, it is favorable for the crystallinity of the second nitride semiconductor layer 30 to be good so that the diameters of the V-pits are small or the occurrence count of the V-pits is low for the surface of the second nitride semiconductor layer 30 after stacking. The second nitride semiconductor layer 30 is formed using film formation conditions so that such a surface state of the second nitride semiconductor layer 30 is obtained.

The second nitride semiconductor layer 30 is formed as follows. After forming the second p-cladding layer 29, the second nitride semiconductor layer 30 is formed on the second p-cladding layer 29 in a state in which a carrier gas, a gas including gallium, and a gas including nitrogen are introduced to the reactor and the reactor is heated to the same first temperature as when forming the first nitride semiconductor layer 24. For example, an undoped GaN layer is formed as the second nitride semiconductor layer 30. The film thickness of the second nitride semiconductor layer 30 is, for example, not less than 50 nm and not more than 100 nm. The film thickness of the second nitride semiconductor layer 30 is, for example, equal to the film thickness of the first nitride semiconductor layer 24.

The first flow rate of the gas including gallium introduced to the reactor when forming the first nitride semiconductor layer 24 is less than the second flow rate of the gas including gallium introduced to the reactor when forming the second nitride semiconductor layer 30. Because the first flow rate is less than the second flow rate, the film formation rate of the first nitride semiconductor layer 24 is slower than the film formation rate of the second nitride semiconductor layer 30. By setting the film formation rate of the first nitride semiconductor layer 24 to be slow, the crystallinity of the first nitride semiconductor layer 24 can be improved. The drive voltage of the light-emitting element can be reduced thereby because the first p-type nitride semiconductor layer 25 and the n-type intermediate layer 26, which are formed using the first nitride semiconductor layer 24 as a foundation layer, can be formed to have good crystallinity. By considering the thermal damage of the first light-emitting layer 22 and the second light-emitting layer 28 that are already formed when forming the second nitride semiconductor layer 30, it is favorable for the film formation rate of the second nitride semiconductor layer 30 to be faster than the film formation rate of the first nitride semiconductor layer 24. The film formation rate of the first nitride semiconductor layer 24 can be, for example, not less than 2.5 nm/min and not more than 5 nm/min. The film formation rate of the second nitride semiconductor layer 30 can be, for example, not less than 7.5 nm/min and not more than 10 nm/min.

The third flow rate of the gas including gallium introduced to the reactor when forming the first light-emitting layer 22 is equal to the fourth flow rate of the gas including gallium introduced to the reactor when forming the second light-emitting layer 28.

Figure 14A:
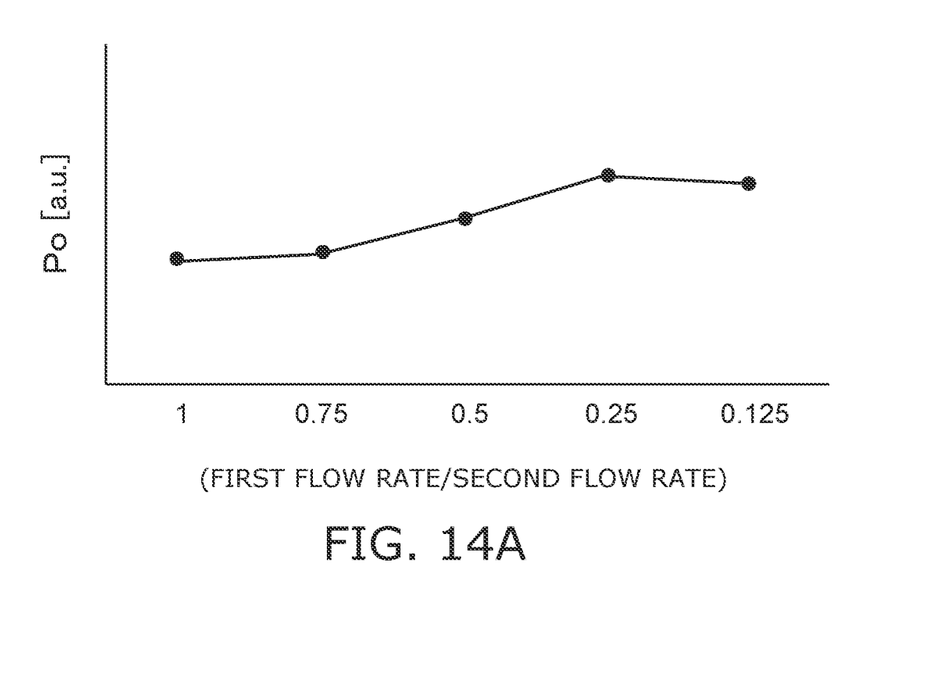
FIG. 14A is a graph illustrating a relationship between an output Po and a ratio of a first flow rate of a gas including gallium when forming a first nitride semiconductor layer to a second flow rate of a gas including gallium when forming a second nitride semiconductor layer.

FIG. 14A is a graph illustrating the relationship between an output (a brightness) Po (a. u.) of the light-emitting element 1 and the ratio of the first flow rate of the gas including gallium when forming the first nitride semiconductor layer 24 to the second flow rate of the gas including gallium when forming the second nitride semiconductor layer 30.

The output Po is the average of values measured at five locations separated 10 mm each along the radial direction from the center of the wafer toward the outer perimeter.

Figure 14B:
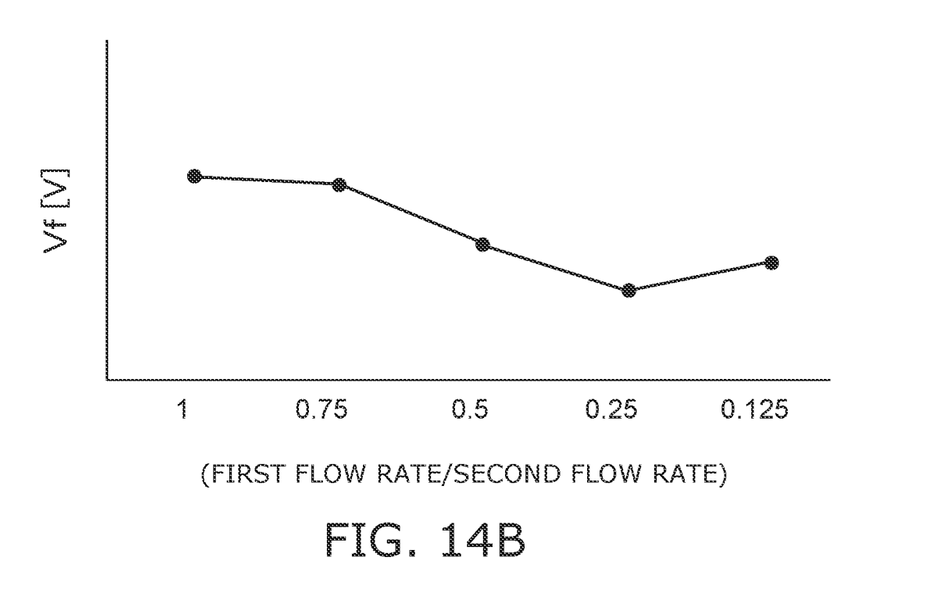
FIG. 14B is a graph illustrating a relationship between a drive voltage Vf and a ratio of a first flow rate of a gas including gallium when forming a first nitride semiconductor layer to a second flow rate of a gas including gallium when forming a second nitride semiconductor layer.

FIG. 14B is a graph illustrating the relationship between the drive voltage Vf (V) of the light-emitting element 1 and the ratio of the first flow rate of the gas including gallium when forming the first nitride semiconductor layer 24 to the second flow rate of the gas including gallium when forming the second nitride semiconductor layer 30. In FIGS. 14A and 14B, the ratio of the first flow rate of the gas including gallium when forming the first nitride semiconductor layer 24 to the second flow rate of the gas including gallium when forming the second nitride semiconductor layer 30 is shown as (first flow rate/second flow rate).

The drive voltage Vf is the average of values measured at five locations separated 10 mm each along the radial direction from the center of the wafer toward the outer perimeter.

As shown in FIG. 14A, compared to when the ratio of the first flow rate to the second flow rate was 1 times, the output Po was increased by reducing the ratio of the first flow rate to the second flow rate to 0.75 times, 0.5 times, 0.25 times, and 0.125 times. It is considered that this is because the crystallinity of the semiconductor layer of the first nitride semiconductor layer 24 was good due to the slow film formation rate of the first nitride semiconductor layer 24. It is estimated that the output Po was increased because the degradation of the crystallinity could be suppressed for the second light-emitting layer 28 formed on the first nitride semiconductor layer 24, which had good crystallinity.

As shown in FIG. 14B, compared to when the ratio of the first flow rate to the second flow rate was 1 times, the drive voltage Vf was reduced by reducing the ratio of the first flow rate to the second flow rate to 0.75 times, 0.5 times, 0.25 times, and 0.125 times. It is considered that this is because the crystallinity of the semiconductor layer of the first nitride semiconductor layer 24 was good due to the slow film formation rate of the first nitride semiconductor layer 24. It is estimated that the drive voltage Vf was reduced because the degradation of the crystallinity could be suppressed for the first p-type nitride semiconductor layer 25 and the n-type intermediate layer 26, which form the tunnel junction and are formed on the first nitride semiconductor layer 24, which has good crystallinity.

From the results of FIGS. 14A and 14B, it is favorable for the first flow rate of the gas including gallium introduced to the reactor when forming the first nitride semiconductor layer 24 to be not less than 0.125 times and not more than 0.5 times the second flow rate of the gas including gallium introduced to the reactor when forming the second nitride semiconductor layer 30. Considering the thermal damage to the semiconductor layers due to a slow film formation rate of the semiconductor layers, it is more favorable for the first flow rate of the gas including gallium introduced to the reactor when forming the first nitride semiconductor layer 24 to be not less than 0.25 times and not more than 0.5 times the second flow rate of the gas including gallium introduced to the reactor when forming the second nitride semiconductor layer 30.

Embodiments of the present invention have been described with reference to specific examples. However, the present invention is not limited to these specific examples. Based on the above-described embodiments, all embodiments that can be implemented with appropriate design modification by one skilled in the art are also within the scope of the present invention as long as the gist of the present invention is included. Further, within the scope of the spirit of the present invention, one skilled in the art can conceive various modifications, and the modifications fall within the scope of the present invention.

What is claimed is:

1. A method for manufacturing a light-emitting element, the method comprising:
    forming a first n-type nitride semiconductor layer comprising an n-type impurity;
    forming a first light-emitting layer on the first n-type nitride semiconductor layer;

forming an undoped first nitride semiconductor layer on the first light-emitting layer, which comprises introducing, to a reactor, a gas comprising nitrogen, and a gas comprising gallium and having a first flow rate;

forming a first p-type nitride semiconductor layer on the first nitride semiconductor layer;

forming an n-type intermediate layer on the first p-type nitride semiconductor layer, the n-type intermediate layer being made of a nitride semiconductor layer comprising an n-type impurity and having a higher impurity concentration than the first n-type nitride semiconductor layer;

forming a second n-type nitride semiconductor layer on the n-type intermediate layer;

forming a second light-emitting layer on the second n-type nitride semiconductor layer;

forming an undoped second nitride semiconductor layer on the second light-emitting layer, which comprises introducing, to the reactor, a gas comprising nitrogen, and a gas comprising gallium and having a second flow rate; and forming a second p-type nitride semiconductor layer on the second nitride semiconductor layer, wherein the first flow rate is less than the second flow rate.

2. The method according to claim 1, wherein:
the first flow rate is not less than 0.125 times and not more than 0.5 times the second flow rate.

3. The method according to claim 1, wherein:
the first p-type nitride semiconductor layer comprises magnesium as a p-type impurity, and
an impurity concentration of the first p-type nitride semiconductor layer is not less than $5\times10^{19}$/cm$^3$ and not more than $2\times10^{21}$/cm$^3$.

4. The method according to claim 2, wherein:
the first p-type nitride semiconductor layer comprises magnesium as a p-type impurity, and
an impurity concentration of the first p-type nitride semiconductor layer is not less than $5\times10^{19}$/cm$^3$ and not more than $2\times10^{21}$/cm$^3$.

5. The method according to claim 1, wherein:
the n-type intermediate layer comprises silicon as an n-type impurity, and
an impurity concentration of the n-type intermediate layer is not less than $1\times10^{20}$/cm$^3$ and not more than $5\times10^{21}$/cm$^3$.

6. The method according to claim 2, wherein:
the n-type intermediate layer comprises silicon as an n-type impurity, and
an impurity concentration of the n-type intermediate layer is not less than $1\times10^{20}$/cm$^3$ and not more than $5\times10^{21}$/cm$^3$.

7. The method according to claim 3, wherein:
the n-type intermediate layer comprises silicon as an n-type impurity, and
an impurity concentration of the n-type intermediate layer is not less than $1\times10^{20}$/cm$^3$ and not more than $5\times10^{21}$/cm$^3$.

8. The method according to claim 1, wherein:
the step of forming the first light-emitting layer comprises introducing, to the reactor, a gas comprising nitrogen, and a gas comprising gallium and having a third flow rate,
the step of forming the second light-emitting layer comprises introducing, to the reactor, a gas comprising nitrogen, and a gas comprising gallium and having a fourth flow rate, and
the third flow rate is equal to the fourth flow rate.

9. The method according to claim 1, wherein:
the step of forming the first p-type nitride semiconductor layer comprises forming the first p-type nitride semiconductor layer in contact with the first nitride semiconductor layer.

10. The method according to claim 2, wherein:
the step of forming the first p-type nitride semiconductor layer comprises forming the first p-type nitride semiconductor layer in contact with the first nitride semiconductor layer.

11. The method according to claim 3, wherein:
the step of forming the first p-type nitride semiconductor layer comprises forming the first p-type nitride semiconductor layer in contact with the first nitride semiconductor layer.

12. The method according to claim 1, wherein:
the first nitride semiconductor layer and the second nitride semiconductor layer are made of gallium nitride.

13. The method according to claim 1, wherein:
the gas comprising gallium introduced to the reactor when forming the first nitride semiconductor layer and the gas comprising gallium introduced to the reactor when forming the second nitride semiconductor layer are trimethylgallium gas or triethylgallium gas.

14. The method according to claim 1, wherein:
film thicknesses of the first and second nitride semiconductor layers are not less than 50 nm and not more than 100 nm.

15. The method according to claim 2, wherein:
film thicknesses of the first and second nitride semiconductor layers are not less than 50 nm and not more than 100 nm.

16. The method according to claim 3, wherein:
film thicknesses of the first and second nitride semiconductor layers are not less than 50 nm and not more than 100 nm.

17. The method according to claim 1, further comprising:
after the step of forming of the first light-emitting layer, forming a first p-cladding layer on the first light-emitting layer,
wherein, in the step of forming the first nitride semiconductor layer, the first nitride semiconductor layer is formed in contact with the first p-cladding layer.

18. The method according to claim 1, further comprising:
after the step of forming of the second light-emitting layer, forming a second p-cladding layer on the second light-emitting layer,
wherein, in the step of forming the first nitride semiconductor layer, the second nitride semiconductor layer is formed in contact with the second p-cladding.

* * * * *